(12) United States Patent
Gangi

(10) Patent No.: US 7,161,416 B2
(45) Date of Patent: Jan. 9, 2007

(54) PROGRAMMABLE FILTER

(75) Inventor: Frank Gangi, Little Falls, NJ (US)

(73) Assignee: BAE Systems Information and Electronic Systems Integration Inc., Wayne, NJ (US)

( * ) Notice: Subject to any disclaimer, the term of this patent is extended or adjusted under 35 U.S.C. 154(b) by 358 days.

(21) Appl. No.: 10/894,507

(22) Filed: Jul. 20, 2004

(65) Prior Publication Data

US 2006/0019626 A1    Jan. 26, 2006

(51) Int. Cl.
  H04B 1/18 (2006.01)
  H04B 1/10 (2006.01)
  H04B 1/16 (2006.01)

(52) U.S. Cl. .................. 327/552; 455/191.1; 455/307; 455/340; 375/350

(58) Field of Classification Search .. 455/191.1–191.3, 455/286, 307, 339–340; 327/552; 375/350
See application file for complete search history.

(56) References Cited

U.S. PATENT DOCUMENTS

| | | | |
|---|---|---|---|
| 4,590,611 A | 5/1986 | Maier et al. | |
| 4,685,150 A | 8/1987 | Maier | |
| 5,270,875 A * | 12/1993 | Shah et al. | 360/46 |
| 5,543,764 A | 8/1996 | Turunen et al. | |
| 5,550,520 A | 8/1996 | Kobayashi | |
| 6,242,982 B1 * | 6/2001 | Ibelings et al. | 330/279 |
| 6,307,442 B1 * | 10/2001 | Meyer et al. | 333/17.1 |
| 6,469,856 B1 | 10/2002 | Mitchell et al. | |
| 6,470,275 B1 | 10/2002 | Dubinsky | |
| 2001/0028275 A1 | 10/2001 | Matsugatani et al. | |
| 2002/0051502 A1 * | 5/2002 | Mathe | 375/316 |
| 2004/0196934 A1 * | 10/2004 | Petrov et al. | 375/350 |
| 2004/0235445 A1 * | 11/2004 | Gomez | 455/307 |
| 2005/0123036 A1 * | 6/2005 | Rahman et al. | 375/240 |
| 2005/0186930 A1 * | 8/2005 | Rofougaran et al. | 455/260 |

FOREIGN PATENT DOCUMENTS

| | | |
|---|---|---|
| GB | 1410251 | 10/1975 |
| JP | 55 095473 | 7/1980 |

* cited by examiner

*Primary Examiner*—Simon Nguyen
(74) *Attorney, Agent, or Firm*—David L. Davis

(57) ABSTRACT

A filter wherein the poles and zeroes are programmable in a high speed control loop to form a particular desired filter profile. The control loop retrains the filter's poles and zeroes during the "off" time between the reception or transmission time slots. Desired pole and zero frequencies are injected and peak values are stored in sample and hold circuits. This eliminates variations from voltage supplies, component tolerance, temperature, aging, etc.

12 Claims, 6 Drawing Sheets

PROGRAMMABLE FILTER

BACKGROUND OF THE INVENTION

This invention relates to electrical signal filters and, more particularly, to such a filter in which the poles and/or zeroes of the filter are programmably tunable to optimize performance of the filter.

It is known to provide a filter which has a fixed center frequency and bandwidth. Due to component variations, aging, temperature effects, etc., the performance of such a filter is not accurately predictable. It is also known to provide a voltage tunable filter with a fixed bandwidth and a variable center frequency controlled by a digital-to-analog converter and a look-up table. This type of filter also suffers from the same type of disadvantages. It would therefore be desirable to have a filter which is adaptively programmable to overcome the effects of component variations, aging, temperature, etc.

SUMMARY OF THE INVENTION

According to the present invention, a programmable filter for a signal comprises an input stage providing a signal to be filtered and a tunable tank circuit coupled to the input stage and defining a pole of the filter at a defined frequency. The tunable tank circuit includes a filter network having a voltage tunable device, a capacitor and an inductor. The filter network has an input and an output, wherein the signal to be filtered is applied to the input of the filter network. The tank circuit also includes an amplification stage having an input and an output, wherein the input of the amplification stage is connected to the output of the filter network. A peak detector is coupled to the output of the amplification stage. A sample and hold circuit having an input and an output is provided, wherein the input of the sample and hold circuit is connected to the peak detector. A first single pole double throw switch is connected between the voltage tunable device and the input and output of the sample and hold circuit, to selectively connect either the input or the output of the sample and hold circuit to the voltage tunable device. A tuning signal source provides a tuning signal at a selectively controllable frequency, and a second single pole double throw switch is connected between the input of the filter network, and the input stage and the tuning signal source, to selectively provide either the signal to be filtered from the input stage or the tuning signal to the filter network. A controller is coupled to the first and second switches and is operative to: (a) control the tuning signal source to provide the tuning signal at the defined frequency; (b) first control the first and second switches so that the tuning signal is applied to the input of the filter network and the input of the sample and hold circuit is applied to the voltage tunable device; and (c) then control the first and second switches so that the signal to be filtered from the input stage is applied to the input of the filter network and the output of the sample and hold circuit is applied to the voltage tunable device.

Further according to this invention, additional similar circuitry is provided for tuning a zero of the filter, wherein a peak detector is also used.

BRIEF DESCRIPTION OF THE DRAWINGS

The foregoing will be more readily apparent from reading the following description in conjunction with the drawings in which like elements in different figures thereof are identified by the same reference numeral and wherein.

DETAILED DESCRIPTION

Figure 1:
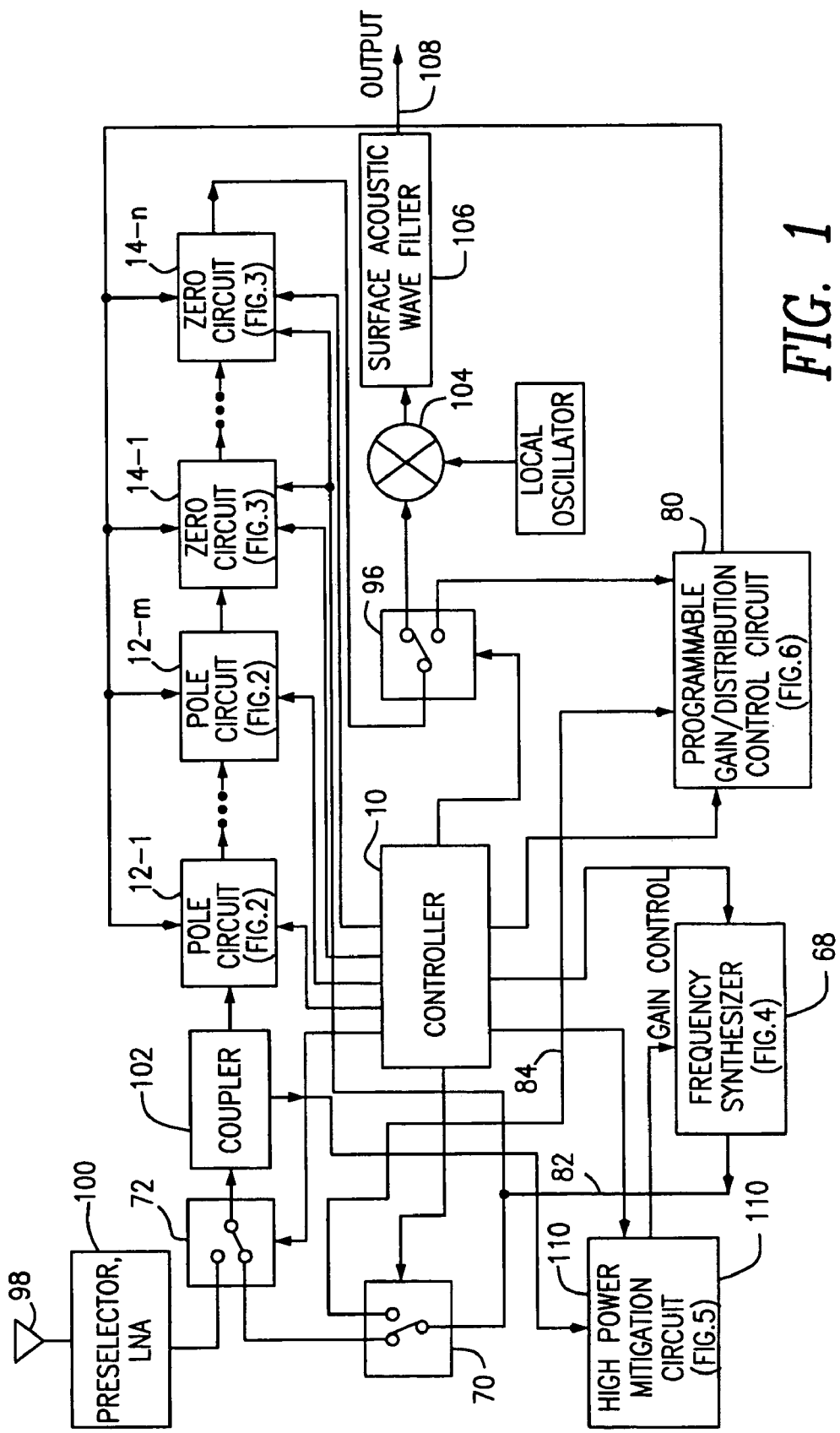
FIG. 1 is a generalized block diagram of a programmable filter system constructed according to this invention.

Referring to the drawings, the inventive filter system operates under the control of the controller 10 (FIG. 1), which may be a programmed microprocessor. Each of the serially connected pole and zero circuits 12-1 through 12-m and 14-1 through 14-n, respectively, is tuned independently using its own internal voltage tunable device in a training sequence during an "off" period for the filter system between active receive/transmit time slots. According to the present invention, the filter system can have any number of pole and zero circuits to achieve a desired transfer function having poles and zeroes at respective defined frequencies in order to get a desired frequency response in terms of bandwidth, shape factor, gain, phase and group delay variation. Each of the pole and zero circuits is tuned individually and independently by injecting a signal at its respective defined frequency and then controlling the voltage applied to the internal voltage tunable device to either maximize (for a pole) or minimize (for a zero) the output of the respective pole or zero circuit. If the frequency response has to be changed, the positions in frequency of the poles and zeroes can be easily modified by the inventive filter system.

Figure 2:
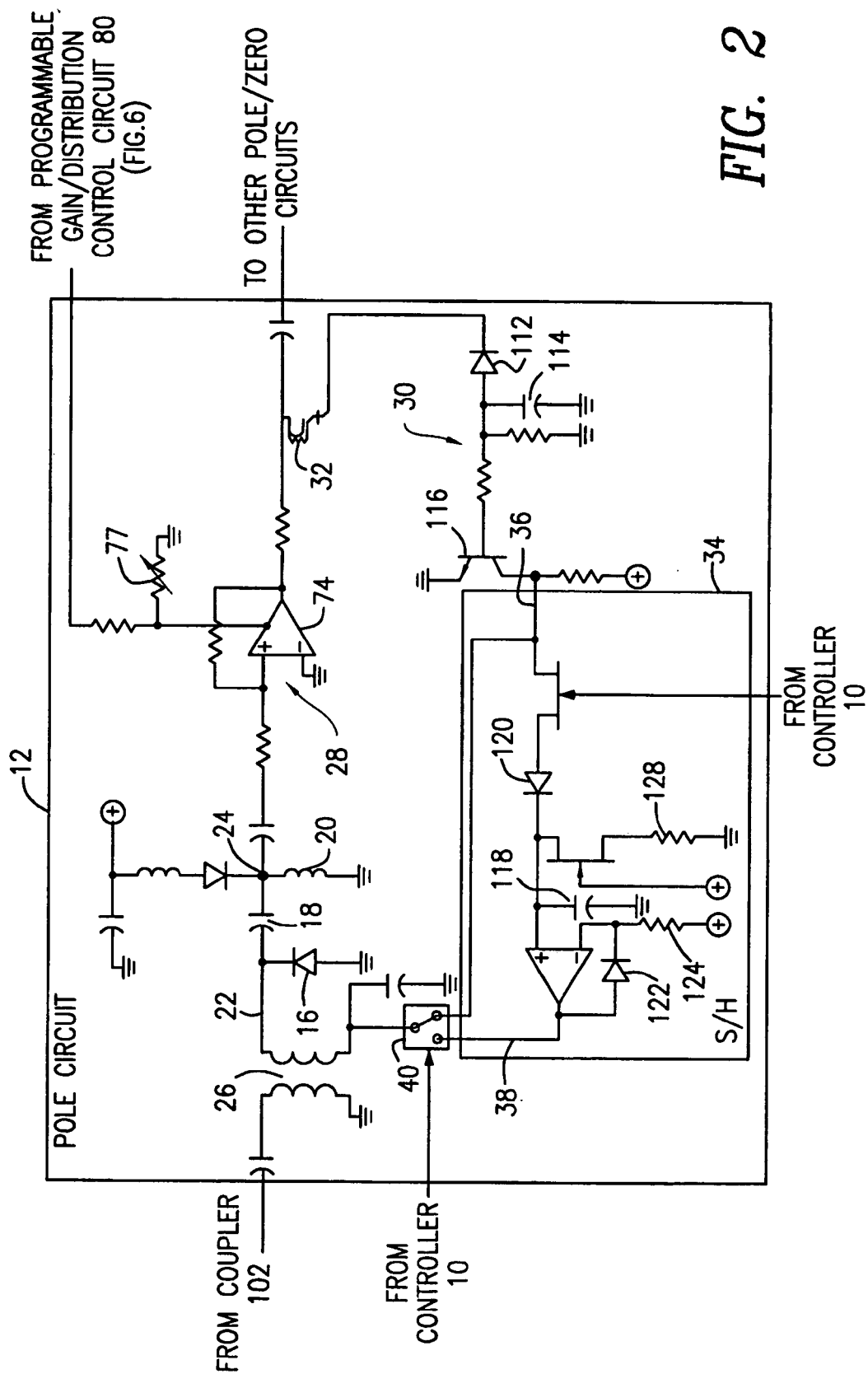
FIG. 2 is a schematic circuit diagram of an illustrative tunable pole circuit which may be incorporated in the system of FIG. 1.

The pole circuits 12-1 through 12-m are preferably identical, with each pole circuit 12 (FIG. 2) including a filter network (tank circuit) having a varactor 16, a capacitor 18 and an inductor 20. (Although the tunable element in the filter network has been disclosed as a varactor, it will be appreciated that other voltage tunable devices, such as a thin film ferroelectric capacitor or a micro electro-mechanical system (MEMS), for example, can be utilized as well to practice the present invention.) The filter network has an input 22 and an output 24 and the signal to be filtered is applied to the filter network input 22, illustratively through the coupling transformer 26. The pole circuit 12 also includes an amplification stage 28 having an input coupled to the filter network output 24, and a peak detector 30 coupled to the output of the amplification stage 28 through the coupler 32. The pole circuit 12 further includes a sample and hold (S/H) circuit 34 having an input 36 and an output 38, with the sample and hold circuit input 36 being connected to the peak detector 30. A single pole double throw switch 40 is connected between the varactor 16 (through the secondary of the coupling transformer 26) and the sample and hold circuit input 36 and output 38, to selectively connect either the input 36 or the output 38 of the sample and hold circuit 34 to the varactor 16, under control of the controller 10.

The zero circuits 14-1 through 14-n are preferably identical, with each zero circuit 14 (FIG. 3) including a filter network (series resonant circuit) having a varactor 42, a capacitor 44, an inductor 46 and a resistor 47. The filter network has an input 48 and an output 50 and the signal to be filtered is applied to the filter network input 48, illustratively through the coupling transformer 52 and the switch 73. The zero circuit 14 also includes an amplification stage 54 having an input coupled to the filter network output 50, and a peak detector 56 coupled to the resistor 47. A peak detector can be used to determine minimum output from a zero circuit because this corresponds to maximum energy shunted by the series resonant circuit. If the output impedance of the frequency synthesizer 68 is very low, the tap for the peak detector 56 can be directly from the inductor 46, eliminating the resistor 47. The zero circuit 14 further includes a sample and hold (S/H) circuit 60 having an input 62 and an output 64, with the sample and hold circuit input 62 being connected to the peak detector 56. A single pole double throw switch 66 is connected between the varactor 42 (through the inductor 67) and the sample and hold circuit input 62 and output 64, to selectively connect either the input 62 or the output 64 of the sample and hold circuit 60 to the varactor 42, under control of the controller 10.

Figure 4:
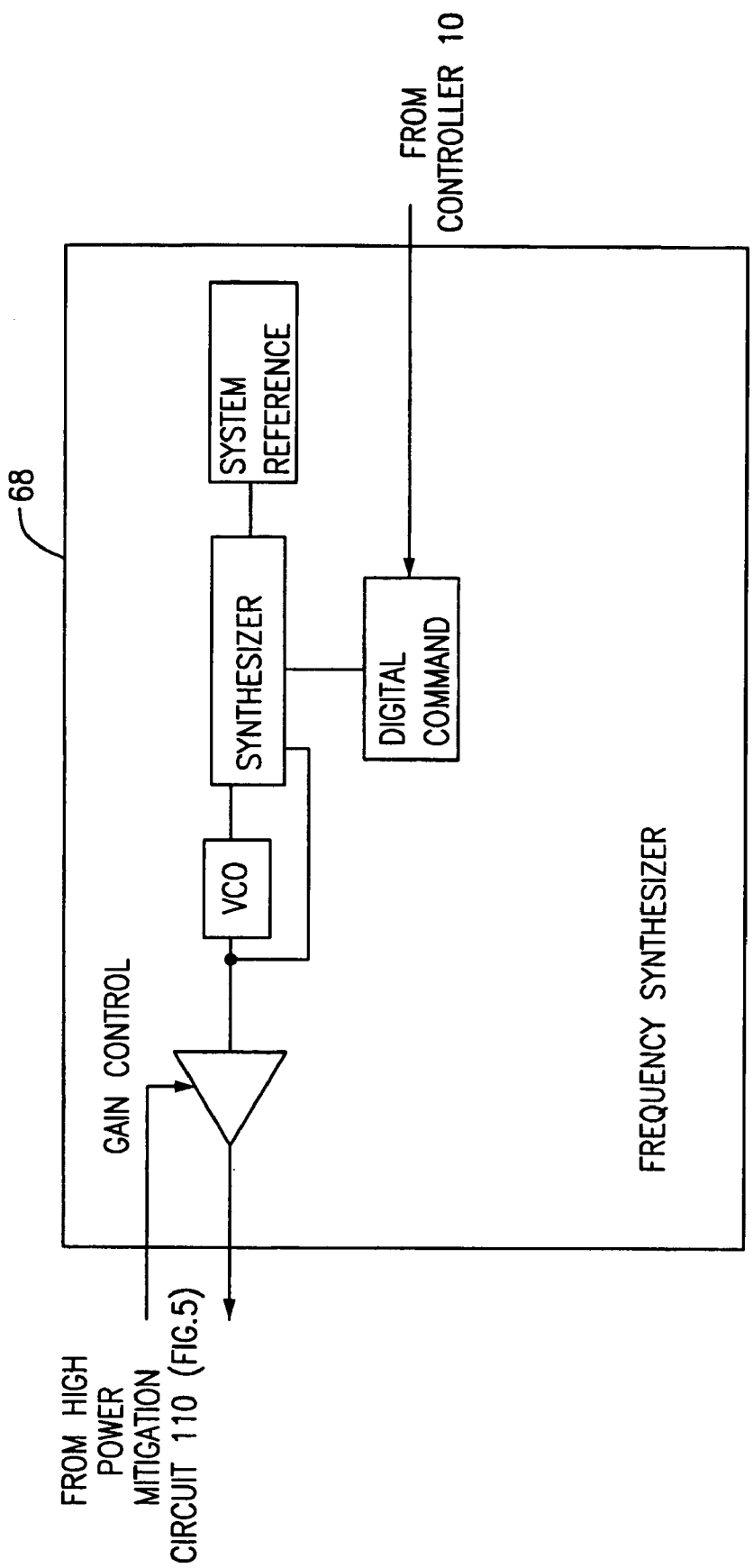
FIG. 4 is a block diagram of an illustrative frequency synthesizer which may be incorporated in the system of FIG. 1.
Figure 5:
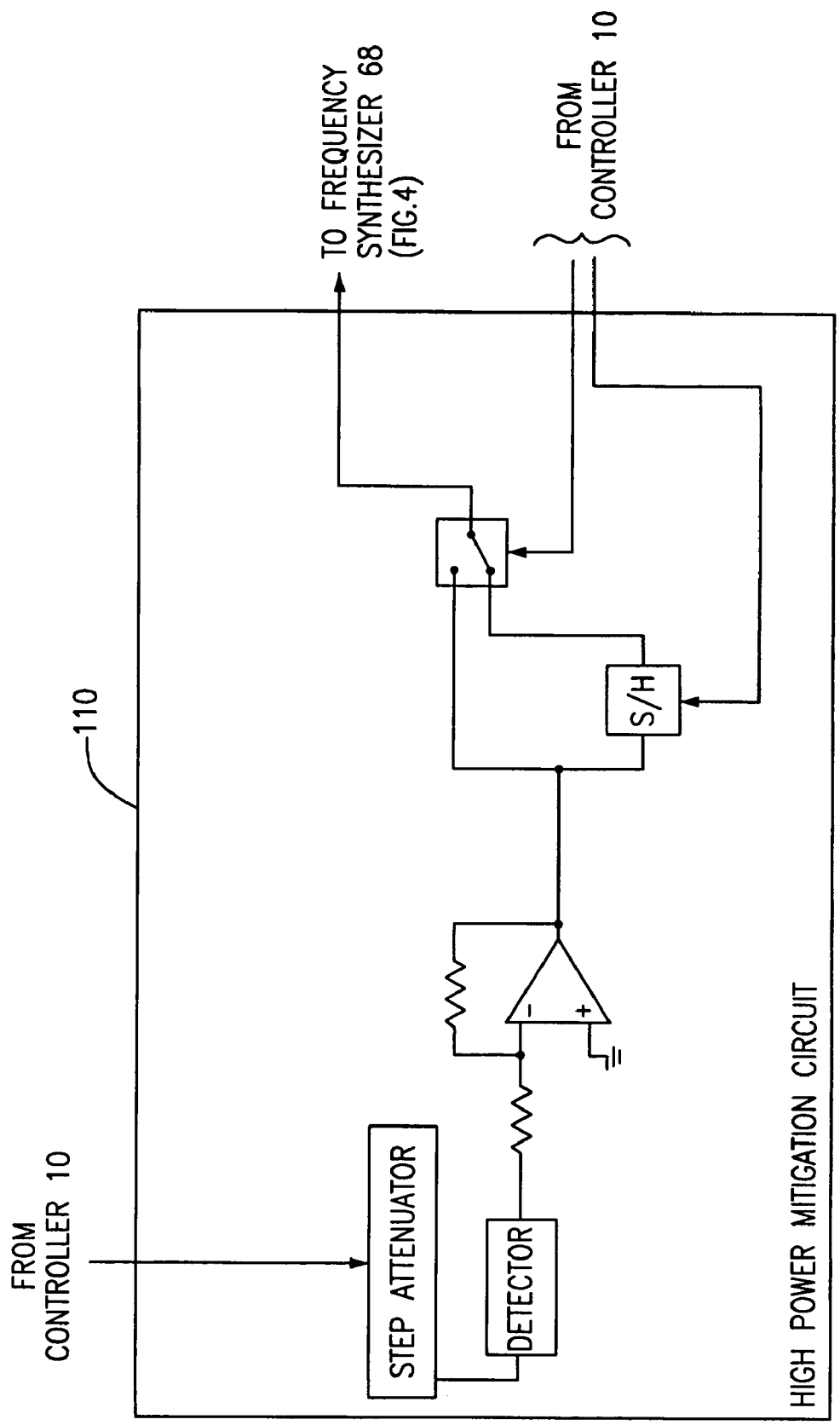
FIG. 5 is a block diagram of an illustrative high power mitigation circuit which may be incorporated in the system of FIG. 1.

As will be described, under the control of the controller 10 during a training sequence for a pole, the desired pole frequency is injected from the frequency synthesizer 68 (FIG. 4), functioning as a tuning signal source, through the switches 70 and 72 (FIG. 1) which are set by the controller 10 to the positions shown. The appropriate one of the pole circuits 12-1 through 12-m auto tunes its internal varactor voltage to maximize its output at the injected frequency. The sample and hold circuit 34 of the pole circuit corresponding to the injected frequency will retain this varactor voltage on its internal storage capacitor. This is repeated for all the desired pole frequencies. The switch 40 is then controlled to apply the retained voltage to the varactor 16. When a zero circuit 14 is being tuned, the tuning signal from the frequency synthesizer 68 is applied directly to that zero circuit through the switch 73. Otherwise, if the tuning signal was to be fed serially through all the zero circuits, the first zero circuits in the string would dissipate most of the energy in the tuning signal because the zero frequencies are relatively closely spaced.

Figure 3:
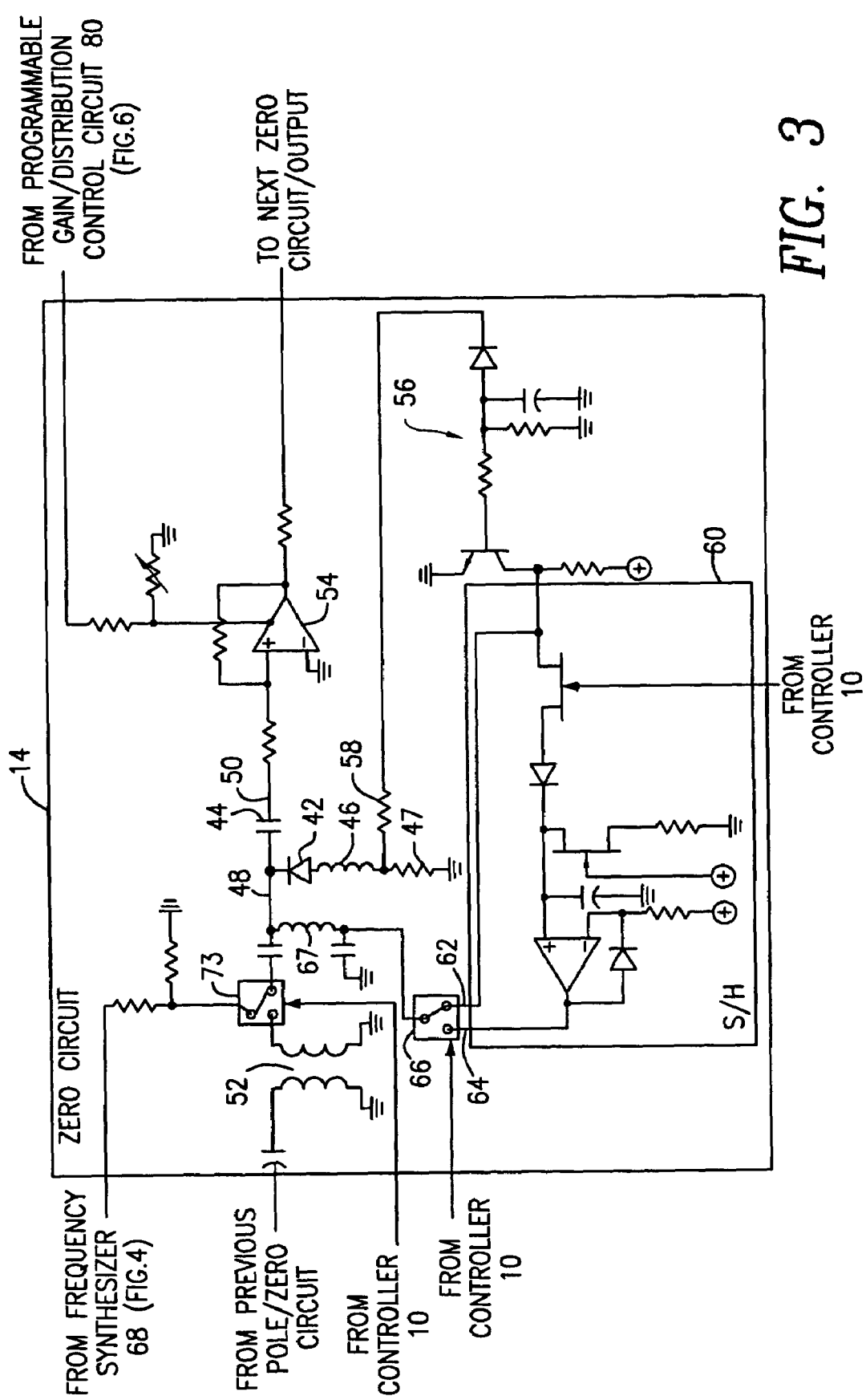
FIG. 3 is a schematic circuit diagram of an illustrative tunable zero circuit which may be incorporated in the system of FIG. 1.
Figure 6:
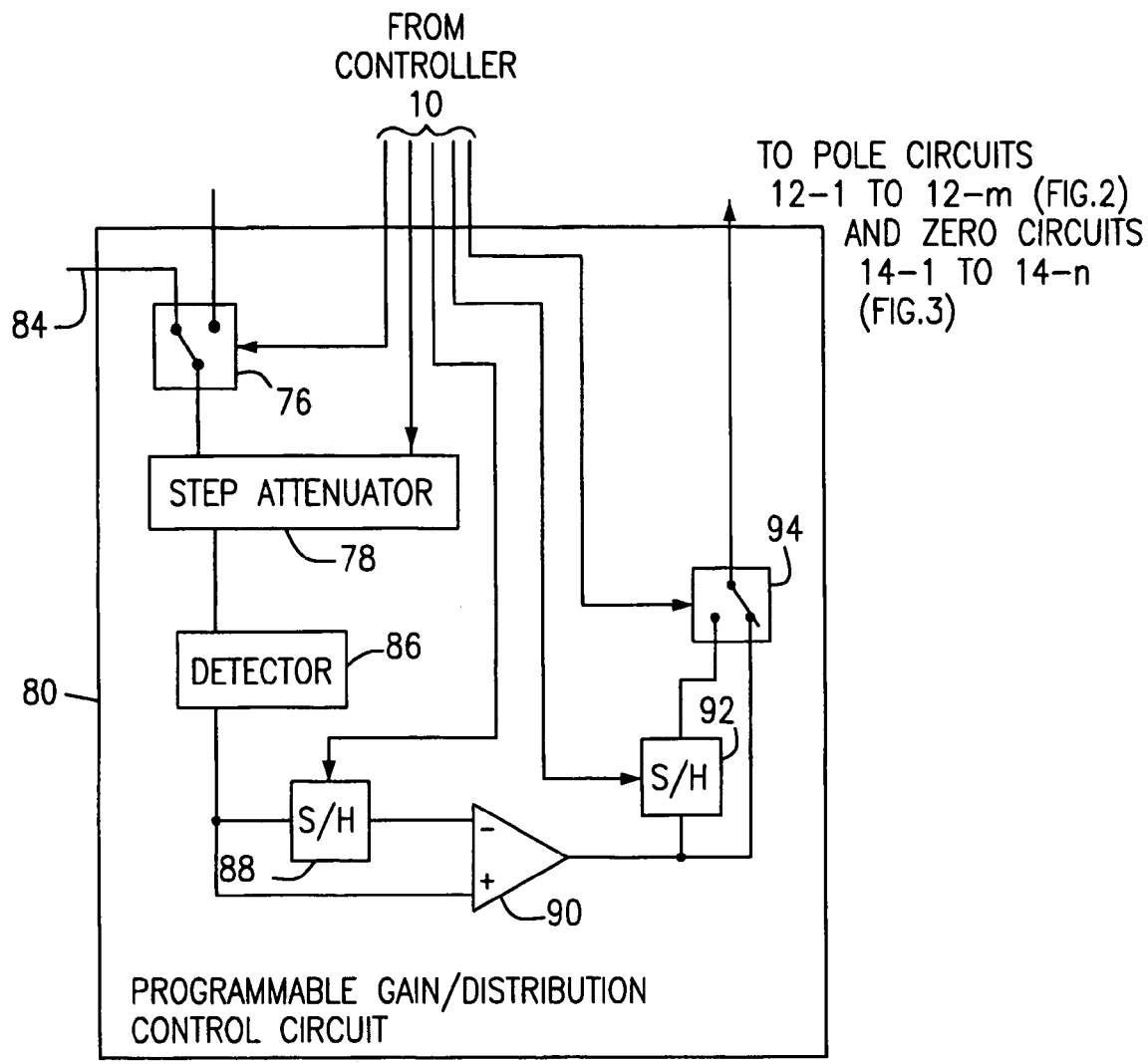
FIG. 6 is a block diagram of an illustrative programmable gain/distribution control circuit which may be incorporated in the system of FIG. 1.

The next step is to obtain the desired gain profile of the filter system with the voltage controlled gain amplifiers 74 (FIG. 2) and 54 (FIG. 3). Note that the variable resistor 77 can be adjusted independently to get a different gain (incremental transfer function weighting) for each pole circuit 12 and zero circuit 14 to optimize for system noise figure, linearity, compression, etc. The gain control feature is exercised by setting the switches 70 (FIG. 1) and 76 (FIG. 6) to provide a signal path from the frequency synthesizer 68 to the step attenuator 78 of the programmable gain/distribution control circuit 80 (FIG. 6) over the leads 82 and 84. This provides a reference. The frequency synthesizer 68 is set midband and the step attenuator 78 is set to 0 db. The detector 86 provides a voltage to the sample and hold (S/H) circuit 88. The switches 70 and 76 are then set to provide a signal path from the frequency synthesizer 68 through the pole and zero circuits 12-1 through 12-m and 14-1 through 14-n to the step attenuator 78, the detector 86 and the comparator 90. Then, the attenuator 78 is set to the desired gain and the voltage on the sample and hold circuit 88 is compared to the detected signal. This loop settles on an optimum voltage for the amplifiers 74 and 54. The sample and hold circuit 92 then stores this voltage and the switch 94 is controlled to provide the stored voltage to the amplifier 74 in all the pole circuits 12-1 through 12-m and the amplifier 54 in all the zero circuits 14-1 through 14-n.

Finally, the switches 72 and 96 are controlled, before the next reception or transmission time slot, to provide a signal path from the antenna 98 and preselector and low noise amplifier 100 through the coupler 102, through the pole and zero circuits 12-1 through 12-m and 14-1 through 14-m making up the programmable filter, into the downconverter mixer 104 and the surface acoustic wave filter 106 to the output 108 of the filter system.

A high power mitigation circuit 110 is provided for increasing the dynamic range (allowing a higher power input) by retuning the poles and zeroes for a higher power situation. Note that without this circuit the poles and zeroes would move away from their desired frequencies because the varactors would become forward biased by the higher input power. The high power mitigation circuit 110 readjusts the poles and zeroes during the training sequence.

The peak detector circuit 30 in the pole circuit 12 uses the signal coupled off the coupler 32 to feed the detector diode 112 to produce a positive voltage on the capacitor 114 which feeds into the base of the NPN transistor 116. When the frequency synthesizer 68 injects the desired frequency into the pole circuit 12, the detected voltage increases. The base current of the transistor 116 will increase, lowering the voltage at the sample and hold circuit input 36. The capacitance of the varactor 16 will increase. As a result, the detected voltage will increase and further increase the base current into the transistor 114, thereby further lowering the voltage at the sample and hold circuit input 36. The control loop function is to allow the voltage to ramp up to the peak detected voltage in order for the sample and hold circuit 34 to hold the desired varactor voltage. When the ramping up voltage passes the peak detected voltage point (due to the control loop seeking the peak), the varactor capacitance is larger at this point and the detected voltage decreases, which results in an increase in the voltage at the sample and hold circuit input 36. As a result, the voltage at the sample and hold circuit input 36 will increase until the peak is reacquired. The control loop will maintain this peak point and the sample and hold circuit 34 will retain the desired varactor voltage. This process is repeated for each of the pole circuits and a corresponding process is performed for the zero circuits, wherein the peak detector 56 can be constructed identically to the peak detector circuit 30 described above.

The sample and hold circuits 34, 60 can be built using discrete components. Alternatively, there are commercially available prepackaged sample and hold integrated circuits as well as digital approaches using analog to digital converters and digital to analog converters. The discrete approach shown in FIG. 2 for the sample and hold circuit 34 uses the capacitor 118 to store the most positive voltage appearing at the sample and hold circuit input 36. The diode 120 will become forward biased to charge the capacitor 118 to the peak input value. If the voltage at the input 36 drops below the voltage on the capacitor 118, the diode 120 will become reverse biased, thus maintaining the peak value on the capacitor 118. The diode 122 serves to cancel the voltage drop error caused by the diode 120. The value of the resistor 124 is chosen to give a zero net offset for the most probable amplitude and duration of the peak input voltages. For high accuracy and long storage duration, the diode 120 should have low leakage. The leakage of the diode 122 is not critical because it is isolated from the capacitor 118. The diodes 120 and 122 should be matched for accuracy over temperature.

The JFET switch 126 is controlled by the controller 10 to discharge the capacitor 118 to zero volts through the resistor 128 for initial conditions. The sample and hold circuit 60 in each zero circuit 14 can be constructed identically to the sample and hold circuit 34 in each pole circuit 12.

Accordingly, there has been disclosed an improved programmable filter. While a preferred embodiment of the present invention has been disclosed herein, it will be appreciated by those of skill in the art that various modifications and adaptations to the disclosed embodiment are possible. It is therefore intended that this invention be limited only by the scope of the appended claims.

What is claimed is:

1. A programmable filter for a signal, comprising:
    an input stage providing a signal to be filtered;
    a tunable tank circuit coupled to the input stage and defining a pole of the filter at a first defined frequency, the tunable tank circuit including:
        a first filter network including a first voltage tunable device, a capacitor and an inductor, the first filter network having an input and an output, wherein the signal to be filtered is applied to the input of the first filter network;
        a first amplification stage having an input and an output, wherein the input of the first amplification stage is connected to the output of the first filter network;
        a peak detector coupled to the output of the amplification stage;
        a first sample and hold circuit having an input and an output, wherein the input of the first sample and hold circuit is connected to the peak detector; and
        a first single pole double throw switch connected between the first voltage tunable device and the input and output of the first sample and hold circuit, to selectively connect either the input or the output of the first sample and hold circuit to the first voltage tunable device;
    a tuning signal source providing a tuning signal at a selectively controllable frequency;
    a second single pole double throw switch connected between the input of the first filter network, and the input stage and the tuning signal source, to selectively provide either the signal to be filtered from the input stage or the tuning signal to the first filter network; and
    a controller coupled to the first and second switches and operative to:
        (a) control the tuning signal source to provide the tuning signal at the first defined frequency;
        (b) first control the first and second switches so that the tuning signal is applied to the input of the first filter network and the input of the first sample and hold circuit is applied to the first voltage tunable device; and
        (c) then control the first and second switches so that the signal to be filtered from the input stage is applied to the input of the first filter network and the output of the first sample and hold circuit is applied to the first voltage tunable device.

2. The filter according to claim 1 wherein the first voltage tunable device comprises a varactor.

3. The filter according to claim 1 further comprising:
    a high power mitigation circuit responsive to a higher power condition and operative to tune the pole for the higher power condition.

4. The filter according to claim 1 wherein the gain of the first amplification stage is selectively controllable, the filter further comprising:
    a gain/distribution control circuit operative to control the gain of the first amplification stage;
    wherein the controller is operative to provide a reference signal and the output of the first amplification stage for comparison by the gain/distribution control circuit to attain an optimum gain setting for the first amplification stage.

5. The filter according to claim 1 further comprising:
    a tunable series resonant circuit in series with the tunable tank circuit and defining a zero of the filter at a second defined frequency, the tunable series resonant circuit including:
        a second filter network including a second voltage tunable device, a capacitor, an inductor and a resistor, the second filter network having an input and an output, wherein the signal to be filtered is applied to the input of the second filter network;
        a second amplification stage having an input and an output, wherein the input of the second amplification stage is connected to the output of the second filter network;
        a peak detector coupled to the resistor of the series resonant circuit;
        a second sample and hold circuit having an input and an output, wherein the input of the second sample and hold circuit is connected to the peak detector;
        a third single pole double throw switch connected between the second voltage tunable device and the input and output of the second sample and hold circuit, to selectively connect either the input or the output of the second sample and hold circuit to the second voltage tunable device; and
        a fourth single pole double throw switch connected between the input of the second filter network, and the input stage and the tuning signal source, to selectively provide either the signal to be filtered from the input stage or the tuning signal to the second filter network;
    wherein the controller is further connected to the third switch and is further operative to
        (d) control the tuning signal source to provide the tuning signal at the second defined frequency;
        (e) first control the third and fourth switches so that the tuning signal is applied to the input of the second filter network and the input of the sample and hold circuit is applied to the second voltage tunable device; and
        (f) then control the third and fourth switches so that the signal to be filtered from the input stage is applied to the input of the second filter network and the output of the second sample and hold circuit is applied to the second voltage tunable device.

6. The filter according to claim 5 wherein the second voltage tunable device comprises a varactor.

7. The filter according to claim 5 further comprising:
    a high power mitigation circuit responsive to a higher power condition and operative to tune the zero and the pole for the higher power condition.

8. The filter according to claim 5 wherein the gain of the second amplification stage is selectively controllable, the filter further comprising:
    a gain/distribution control circuit operative to control the gain of the second amplification stage;

wherein the controller is operative to provide a reference signal and the output of the second amplification stage for comparison by the gain/distribution control circuit to attain an optimum gain setting for the second amplification stage.

9. A programmable filter for a signal, comprising:

an input stage providing a signal to be filtered;

a tunable series resonant circuit coupled to the input stage and defining a zero of the filter at a defined frequency, the tunable series resonant circuit including:
 a filter network including a voltage tunable device, a capacitor, an inductor and a resistor, the filter network having an input and an output, wherein the signal to be filtered is applied to the input of the filter network;
 an amplification stage having an input and an output, wherein the input of the amplification stage is connected to the output of the filter network;
 a peak detector coupled to the resistor of the series resonant circuit;
 a sample and hold circuit having an input and an output, wherein the input of the sample and hold circuit is connected to the peak detector; and
 a first single pole double throw switch connected between the voltage tunable device and the input and output of the sample and hold circuit, to selectively connect either the input or the output of the sample and hold circuit to the voltage tunable device;

a tuning signal source providing a tuning signal at a selectively controllable frequency;

a second single pole double throw switch connected between the input of the filter network, and the input stage and the tuning signal source, to selectively provide either the signal to be filtered from the input stage or the tuning signal to the filter network; and a controller coupled to the first and second switches and operative to:
 (a) control the tuning signal source to provide the tuning signal at the defined frequency;
 (b) first control the first and second switches so that the tuning signal is applied to the input of the filter network and the input of the sample and hold circuit is applied to the voltage tunable device; and
 (c) then control the first and second switches so that the signal to be filtered from the input stage is applied to the input of the filter network and the output of the sample and hold circuit is applied to the voltage tunable device.

10. The filter according to claim 9 wherein the voltage tunable device comprises a varactor.

11. The filter according to claim 9 further comprising:
a high power mitigation circuit responsive to a higher power condition and operative to tune the zero for the higher power condition so as to increase the dynamic range of the filter.

12. The filter according to claim 9 wherein the gain of the amplification stage is selectively controllable, the filter system comprising:
a gain/distribution control circuit operative to control the gain of the amplification stage;
wherein the controller is operative to provide a reference signal and the output of the amplification stage for comparison by the gain/distribution control circuit to attain an optimum gain setting for the amplification stage.

* * * * *